United States Patent [19]

Harriott et al.

[11] Patent Number: 5,106,764
[45] Date of Patent: Apr. 21, 1992

[54] DEVICE FABRICATION

[75] Inventors: Lloyd R. Harriott, Somerville; Morton B. Panish, Springfield; Henryk Temkin, Berkeley Heights; Yuh-Lin Wang, North Plainfield, all of N.J.

[73] Assignee: AT&T Bell Laboratories, Murray Hill, N.J.

[21] Appl. No.: 444,579

[22] Filed: Nov. 30, 1989

Related U.S. Application Data

[63] Continuation-in-part of Ser. No. 335,626, Apr. 10, 1989, abandoned, which is a continuation-in-part of Ser. No. 132,757, Dec. 14, 1987, Pat. No. 4,897,361.

[51] Int. Cl.$^5$ ............................................. H01L 21/302
[52] U.S. Cl. ........................................ 437/18; 437/24; 437/81; 437/935; 437/936; 148/DIG. 26; 148/DIG. 111
[58] Field of Search ................. 148/DIG. 625, 26, 46, 148/48, 50, 64, 65, 71, 84, 95, 94, 111, 110, 169, 33, 33.1, 33.2, 33.4; 156/610–614, 643, 644, 648, 659.1, 662; 118/50.1, 620, 718, 719, 723; 437/18, 22, 81, 89, 90, 99, 105, 107, 126, 129, 151, 196, 133, 225, 229, 228, 234, 928, 930, 935, 936, 24

[56] References Cited

U.S. PATENT DOCUMENTS

| 4,405,710 | 9/1983 | Balasubramanyam et al. | 430/31 |
| 4,853,341 | 8/1989 | Nishioka et al. | 437/24 |
| 4,876,112 | 10/1989 | Kaito et al. | 427/38 |
| 4,897,361 | 1/1990 | Harriott et al. | 437/24 |
| 4,933,299 | 6/1990 | Durose | 437/81 |

FOREIGN PATENT DOCUMENTS

| 0075854 | 7/1978 | Japan | 437/935 |
| 0067138 | 5/1980 | Japan . | |
| 0284939 | 12/1987 | Japan . | |
| 0116443 | 5/1988 | Japan . | |
| 0037035 | 2/1989 | Japan . | |

OTHER PUBLICATIONS

Wolf et al., *Silicon Processing for the VLSI Era*, Lattice Press, Sunset Beach, Calif., 1986, pp. 142–143 and 520.
Kato et al., "Submicron Pattern Fabrication by Focused Ion Beams", J. Vac. Sci. Technol., B3(1), Jan./Feb. 1985, pp. 50–53.
Morimoto et al., ". . . Field-Effect Transistor with . . . Exposure of Focused Ion Beams", J. Vac. Sci. Technol. B5(1), Jan./Feb. 1987, pp. 211–214.
Harriott et al., "Micromachining of Optical Structures with Focused Ion Beams", J. Vac. Sci. Technol. B5(1), Jan./Feb. 1987, pp. 207–210.
Kuwano et al., "Resist Patterning . . . Employing Focused Ion Beam Exposure . . . ", J. Voc. Sci. Technol. B3(5), Sep./Oct. 1985, pp. 1357–1361.
Narum et al., "A Variable Energy Focused Ion Beam System for In Situ Microfabrication", J. Vac. Sci. Technol. B6(3), May/Jun. 1988, pp. 966–973.

*Primary Examiner*—Mary Wilczewski
*Attorney, Agent, or Firm*—G. S. Indig

[57] ABSTRACT

Fine featured devices are produced by a series of fabrication steps including exposing selective surface regions to irradiation, e.g. to an ion beam, generally to result in removal of masking material within irradiated regions. In most instances, subsequent etching is under conditions such that bared material is preferentially removed. Etch-removal and irradiation are such that overgrown material is of device quality at least in etched regions. The inventive process is of particular value in the fabrication of integrated circuits, e.g. circuits performing electronic and/or optical functions. The inventive process is expediently used in the fabrication of structures having minimum feature size of 1 micrometer and smaller. Patterning is dependent upon masking material of a maximum thickness of 100 Å.

3 Claims, 4 Drawing Sheets

DEVICE FABRICATION

This is a continuation-in-part of my co-pending application Ser. No. 335,626, filed Apr. 10, 1989, abandoned, which is a continuation-in-part of application Ser. No. 132,757 filed Dec. 14, 1987, now U.S. Pat. No. 4,897,361.

BACKGROUND OF THE INVENTION

The role of miniature, lithographically produced devices in present day technology is well understood. Without integrated circuits—without semiconductor integrated circuits—the story would be quite different. Extension of the technology to incorporate other types of elements—in particular optical elements—is already having an impact.

Fabrication techniques which have brought us to our advanced state, by analogy to conventional photographic processes, depend upon actinic "resist" materials, which like photographic emulsions, yield patterned layers as defined by selective exposure to radiation. Resist chemistry has developed apace. Both positive and negative resists of required sensitivity to the many types of delineating radiation contemplated have emerged. Resists of necessary stability, sensitivity, wavelength selectivity, etc. to accommodate visible, infrared, ultraviolet, e-beam and ion beam radiation are available. Present ability to reliably produce high yield, longlasting circuitry, of critical dimension of a few micrometers and even to one or a fraction of a micrometer, is heavily dependent on the present advanced state of the resist and associated processing chemistry.

For the most part, pattern delineation of resist layers on devices undergoing fabrication has depended upon already-patterned masks, generally self-supporting masks, which pattern flood radiation. Beam writing has also played a role. While its chief significance has been in the fabrication of masks, for example by use of the Electron Beam Exposure System, it has also been used in direct fabrication of devices. Beam writing, avoids use of a mask and makes use of a focused beam, for example of accelerated electrons, to result in changed solubility of the resist to the developer. Another process, ion beam milling avoids the resist as well as the mask and is dependent upon direct physical removal of material through use of relatively high beam energy.

Other developments have brought about sophisticated advances concerning the nature of the device-functional material to be delineated. A variety of processes including Molecular Beam Epitaxy in its various forms, see "Molecular Beam Epitaxy", M. A. Herman, H. Sitter, Springer-Verlag, 1989 and Metal Organic Chemical Vapor Deposition, see J. P. Hirtz, M. Razeghi, M. Bonnet and J. P. Duchemin in "GaInAsP Alloy Semiconductors", ed. by T. P. Pearsall, J. Wiley and Sons, 1982, have emerged to yield extremely well-controlled layers having uniform thicknesses as small as a fraction of a wavelength of radiation within and beyond the visible spectrum. These and other sophisticated processes have been responsible for diminishing dimensions corresponding with line rules as small as fractions of a micrometer.

Lithographic procedures that have served well to this time are not optimal for new device generations. Dimensional control realized by substitution of shorter wavelength delineating radiation—deep ultraviolet or x-ray—is sometimes thwarted, at least in terms of lessened yield, by use of present-day lithographic processing. Problems include contamination as well as damage. A problem, growing in consequence, is crystallographic damage to material being patterned both in terms of such material itself and as propagated in subsequently overgrown material.

It is known that MBE processing is particularly susceptible to contamination resulting from resist residue, as well as residue resulting from resist processing. Chemical residue, necessarily removed before deposition of overlying MBE material, must be completely removed to realize the implicit advantages of the deposition process.

Other forms of contamination are of consequence. Efforts toward finer wavelength radiation—toward x-ray—are complicated by contamination, and sometimes the oxidation itself as resulting from exposure to air atmosphere. Most promising studies based on projection optics have been in the "soft" x-ray spectrum—e.g. 100 Å–200 Å wavelength—at which, dust particles cause a problem—usual carbon- or silicon-containing dust is opaque to x-ray in this wavelength range.

In short, contamination resulting from resist residue, previously of little consequence, as well as problems due to dust particles which may penetrate all but the most sophisticated filtering systems, point to a need for resistless pattern delineation as well as for in situ processing which may be carried out without opening fabrication apparatus to the outside atmosphere.

Direct patterning of device functional material by ion milling has not proven to be the complete solution since the higher energy required may result in crystallographic damage to remaining material. This complicates or even precludes growth of acceptable overlying material, which sometimes relies upon epitaxy for its intended device function.

SUMMARY OF THE INVENTION

The invention involves pattern delineation of devices in fabrication by low dose irradiation—irradiation which in usual case is of sufficiently low energy so as to minimize device—functional damage (an objective which furthered by procedures in which pattern delineation is followed by etch-removal which, itself, results in removal of some damaged material).

A significant aspect of the invention entails recognition that effective masking—e.g. during gaseous etching—may be accomplished by use of extremely thin masking layers. Such masking layers, produced as reaction product of surface material generally with ambient, may be monatomic or of but a few atom thicknesses—in any event of thickness generally no greater than about 100 Å at least in regions of greatest device consequence.

In general, such masking layers, initially continuous, are patterned by selective irradiation to result in local removal—either through direct volatilization or through subsequent removal by means selective to irradiation—modification.

Some of the processes herein depend to greater or lesser extent upon variation in reaction rate induced by damaging—usually crystallographic damaging—resulting from patterning irradiation. Fabrication-consequential damaging may implicitly accompany mask pattern delineation. An alternative relies on a specific damage-inducing procedure or on mask delineation conditions deliberately designed to induce damage. One approach is maskless and relies upon irradiation-induced damage to, itself, result in spatially selective processing, e.g. by virtue of damage-induced increased etch susceptibility.

Pattern delineation, whether resulting in final mask definition and/or damaging as described, may depend upon a writing beam of accelerated ions. Selective material removal is generally in the "positive" sense in that irradiated areas are more readily removed. In the usual instance in which such an irradiation step is followed by etching, the etching procedure, generally dry etching, is preferably conducted so as to result in removal of the entire thickness of material evidencing device-significant damage. The invention is in terms of fabrication procedures as well as product in which at least one critical step depends upon the inventive teaching.

Patterning according to the invention may result in etch-revealed surface on which device grade material may be directly overgrown. This capability permits economical, high yield, fabrication of fine-feature devices and is of particular consequence for device categories expected to play important roles in the future.

The inventive procedures implicitly release only small amounts of material into the ambient, and, so minimize both pressure change and contamination. The invention is of particular consequence in "in situ" processing—particularly processing depending upon evacuated or other controlled ambient as required e.g. for Molecular Beam Epitaxy (MBE) or Chemical Vapor Deposition (CVD) as usefully employed for depositing extremely thin homogeneous layers, more and more contemplated as design rules are reduced to sub-micron levels. Liberation of relatively small amounts of material, e.g. by volatilization of the very small amounts of masking material required, is tolerated within the apparatus used for controlled vacuum/pressure procedures. Permitted in-situ delineation (avoidance of exposure to uncontrolled ambient), in turn, avoids contamination.

While significant versions of the invention depend upon a masking layer, (maximum of 100 Å) the thickness of the masking layer is such that for many purposes processes taught may be regarded as "resistless". Usual resist thickness and composition—composition generally foreign to (chemically dissimilar from) device-consequent material may cause contamination due to resist residue or to agents required for resist processing, e.g., required in its removal. Masking material of the invention is generally free of both problems—residue is likely in such slight amount as to be of little consequence, and in usual instances agents effective in its processing, e.g., in its removal, are those very same agents required in device fabrication. A prime example is the dry etchant used in selective removal of unmasked regions of substrate material—such dry etchant, itself, serves for removal of masking material, e.g. unirradiated masking material, if needed.

As contrasted with resistless processing dependent on ion milling, delineating dosages, in accordance with the invention, are small. Timesaving is itself advantageous. In addition, removal of damaged material by etching in accordance with the invention permits overgrowth of device-functional material.

DETAILED DESCRIPTION

Drawing

Figure 1:
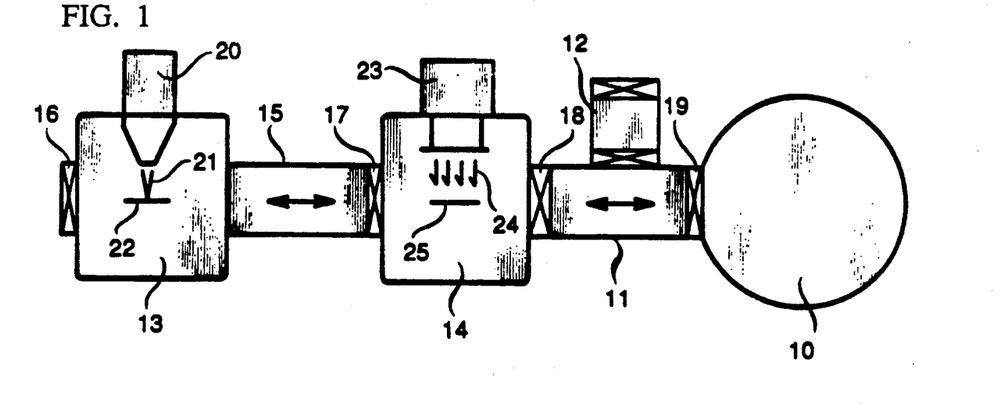
FIG. 1 is a schematic view of illustrative apparatus providing for mask delineation followed by etching and overgrowth.

The apparatus depicted in FIG. 1 consists of deposition apparatus 10, e.g. for gas source molecular beam epitaxy (GSMBE) to which in situ processing apparatus is attached via transfer section 11 which is provided with a load lock 12 though which precursor material may be introduced. In situ apparatus, in the example depicted, consists of beam writing chamber 13 and etching chamber 14 in turn interconnected by transfer section 15. In order to minimize cross-contamination, these chambers are independently pumped and isolated by means of gate valves 16, 17 and 18. Valve 19 performs this function for deposition apparatus 10. As depicted, chamber 13 is provided with beam source 20 for producing moving focused ion beam 21 to result in selective exposure of a surface portion of device 22. Chamber 14 is provided with etchant source 23 to yield etchant 24 to which device 25 is exposed. Chamber 10 is provided with deposition apparatus such as for GSMBE not showing.

As discussed further on, apparatus of FIG. 1 is schematically presented to serve for variations which provide for: e.g. mask patterning as well as beam writing; for a variety of processes based inter alia on direct radiation-induced alteration, e.g. sputter-removal and chemical reaction, as well as variation affecting subsequent processing, e.g. selective baring or crystallographic damaging.

Figure 2:
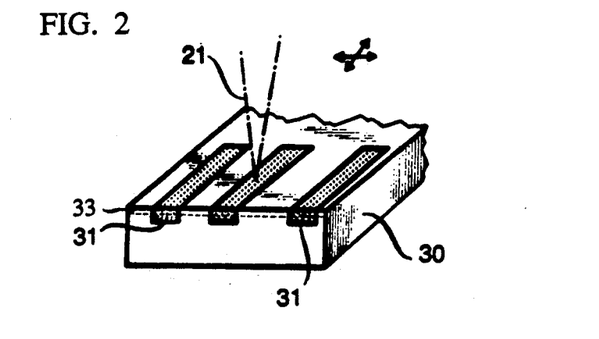
FIGS. 2, 3 and 4 are sequential views in perspective of a relevant portion of a device undergoing processing in the apparatus of FIG. 1.
Figure 3:
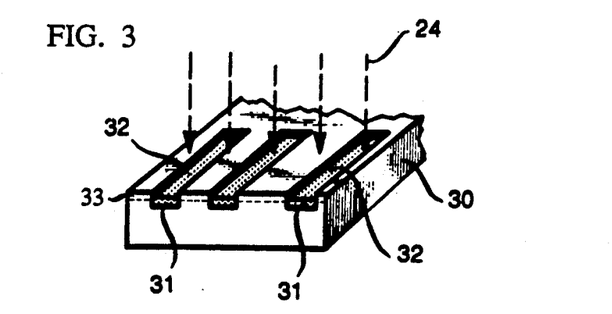
Figure 4:
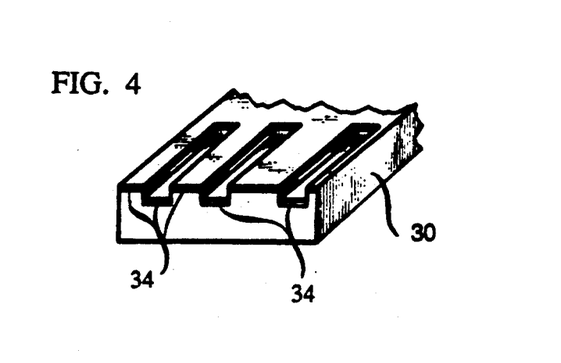

FIGS. 2, 3, 4 discussed in some greater detail in conjunction with an example are described. In FIG. 2 a wafer 30 is undergoing the first step in pattern delineation, that of writing e.g. by ion beam 21. Masking layer 33, present in accordance with a preferred species is patterned by beam 21. Regions 31 are intended to represent regions to be irradiated by beam 21. Under certain processing conditions, as discussed, regions 31, in particular such regions at depth below usual masking layer 33, may represent crystallographically damaged material of processing consequence—e.g. material selectively susceptible to removal by dry etching. In these terms, it is likely that depth of regions 31 is indeed greater than that of masking layer 33. Under other circumstances, perhaps depending simply upon selection of etchant composition, such crystallographic damage may be of little or no processing consequence. Under some circumstances consequential damage may be restricted to a depth equal to that of masking layer 33 to aid in mask patterning, perhaps during the same etching step for removing substrate material. There is difficulty in reliable detection/measurement to show removal of such thin and laterally restricted irradiated regions. There is evidence that under usual conditions irradiation, itself, results in direct volatilization to bare irradiated regions without further processing.

For simplicity, the following description is largely in terms of direct volatilization as occurring during irradiation-patterning. It should be understood that the specific language is not limiting and that it is intended to include procedures in which irradiation does not, per se, result in removal, but in which removal depends upon subsequent processing. Ultimate mask removal may depend upon increased etch susceptibility as discussed, or may be accomplished by alternate means, e.g. by thermal desorption, i.e. simply by increasing temperature at a stage in fabrication in which the mask has served its purpose. Due to the very thin masking layers involved, the two mechanisms are equivalent for most purposes. Generally, no additional precautions need be taken for accommodation of the small amounts masking of material liberated into the ambient regardless of when it occurs.

After transfer to chamber 14 and upon uniform exposure to gaseous etchant 24 at the intermediate time shown, selective removal of material within regions 31 has resulted in recesses 32, which, for this stage, have penetrated to the depth shown into the material of regions 31. Depth correspondence with that of regions 31 as depicted in FIG. 2 is again illustrative. Under certain circumstances there may be such correspondence due to enhanced etch susceptibility due to damage and this may serve a desired objective in fabrication.)

FIG. 4 is illustrative of a preferred aspect of the invention in accordance with which device-grade material may be directly overgrown on etch-revealed substrate. In this instance such overgrowth has produced layered material 34. For this particular illustration, unirradiated masking material 33 had been removed, perhaps by means of etchant 24 or alternatively by thermal desorption so that the material of layer 34 is in direct contact with substrate over the entire surface.

In usual processing, pattern delineation of layer 33 e.g. by focused ion beam 21, results directly in selective removal of irradiated portions. Exposure thereafter to gaseous etchant 24, perhaps as ion assisted, within chamber 14 results in selective removal of material within regions 31, to depth exceeding the thickness of masking layer 33.

FIGS. 5, 6, 7, 8 and 9 are illustrative of device fabrication entailing one or more mask patterning steps. As discussed, it is anticipated that commercial processing will take the form of in situ processing likely involving mask patterning of vacuum deposited material as in MBE. It is contemplated that the figure sequence will be repeated, preferably as required to substantially complete device fabrication.

Figure 5:
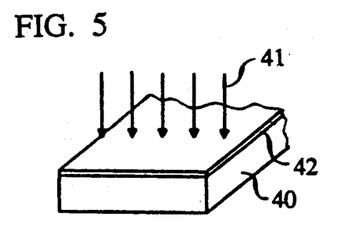
FIGS. 5, 6, 7, 8 and 9 are sequential views in perspective of a relevant portion of a device being fabricated in situ by a series of fabrication steps including both etching and overgrowth.

FIG. 5 provides for reaction of substrate 40 with ambient 41 to result in masking layer 42. In certain of the procedures described pattern delineation was of so-called "native oxide" which was naturally occurring usually due to exposure to air and FIG. 5 is intended to include such a procedure. Controlled formation of masking layer 42 may alternatively take the form of deliberate exposure to reactant material, e.g. air, oxygen, sulphur or other material yielding a mask of properties appropriate to contemplated processing. Desired thickness uniformity, as well as, compositional uniformity of layer 42 are achievable by use of gaseous reactant and this is generally contemplated. Where two or more sequences are entailed, "native oxide" serves only in the first sequence.

Figure 6:
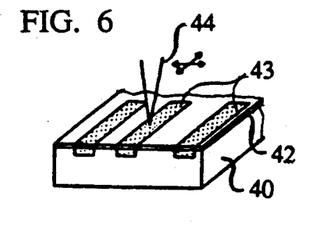

In FIG. 6 substrate 40, now provided with masking layer 42, is irradiated so as to write the desired pattern. As in FIG. 2 the desired pattern is represented as a series of stripes 43. Irradiation of stripes 43 is by beam 44. As in the description of FIG. 2, it is not intended to be specific either to direct sputtering or alternatively to modification of material within the stripes.

Figure 7:
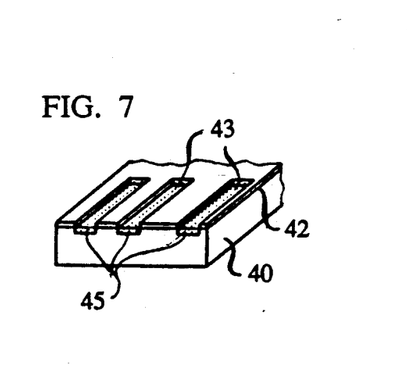

In FIG. 7 the device processed in accordance with FIG. 6 is exposed to etching to result in removal of material within stripe regions 43 so as to produce corresponding recesses 45. At the stage shown, recess depth is approximately equal to that of masking layer 42. Etching is continued to result in removal of some underlying substrate material 40 (not shown in this figure).

Figure 8:
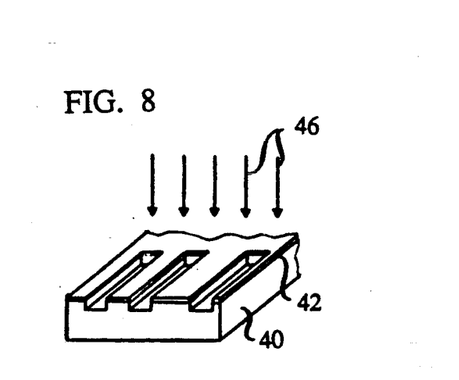

In FIG. 8 thermal desorption, or alternatively, appropriate ambient, shown as arrows 46, is introduced to remove the residual masking layer 42.

Figure 9:
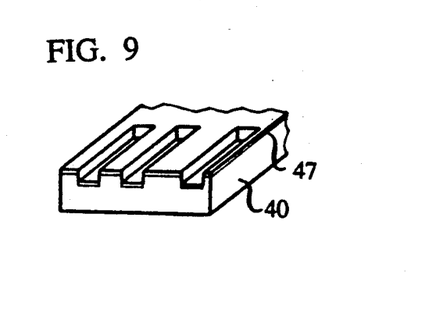

In FIG. 9 a layer of overgrown device-functional material 47 has been introduced perhaps by MBE. Should further processing be required at this stage, the etch-delineated, overgrown substrate is exposed to an ambient 41 to produce masking material as schematically shown in FIG. 5 (but now over a processed surface e.g. as shown in FIG. 9), following which subsequent steps of some or all of FIGS. 6 through 9 are again carried out.

Figure 10:
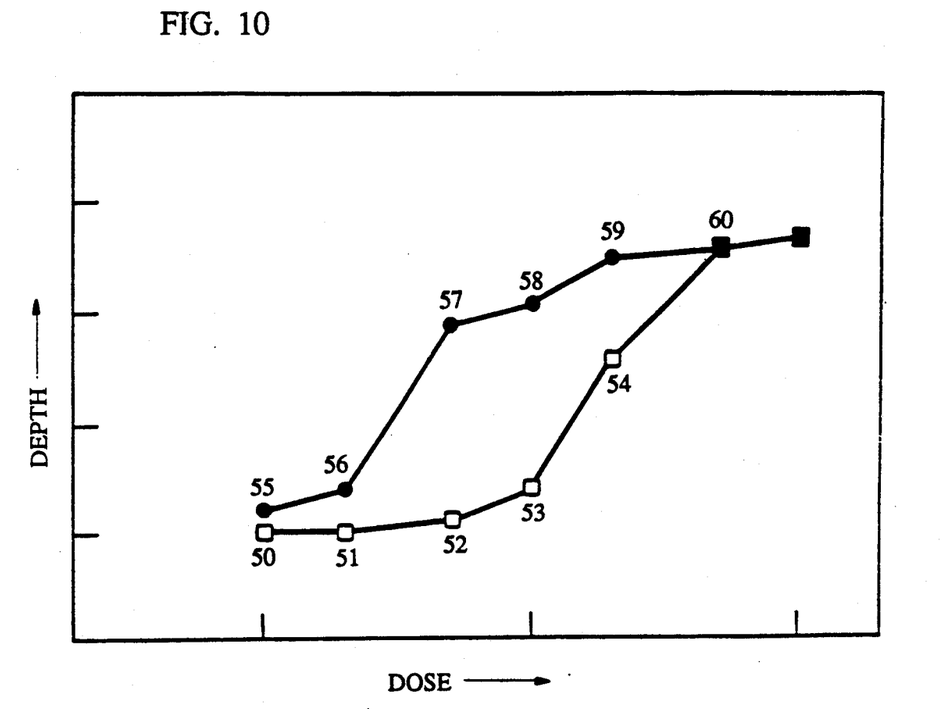
FIG. 10, on ordinate values of depth and abscissa values of irradiation dose, relates etch removal of material due to selective removal of masking material and/or selective damaging in accordance with the invention.
Figure 11:
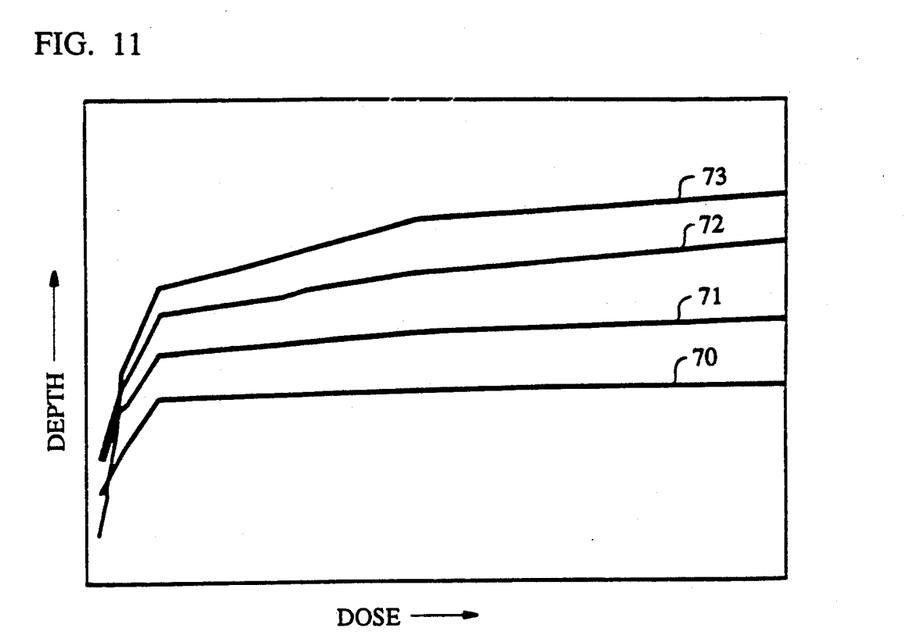
FIG. 11, also on coordinates of depth and dose, relates these two values for an ion assisted, gaseous etching process as depended upon four different values of ion accelerating energy.
Figure 12:
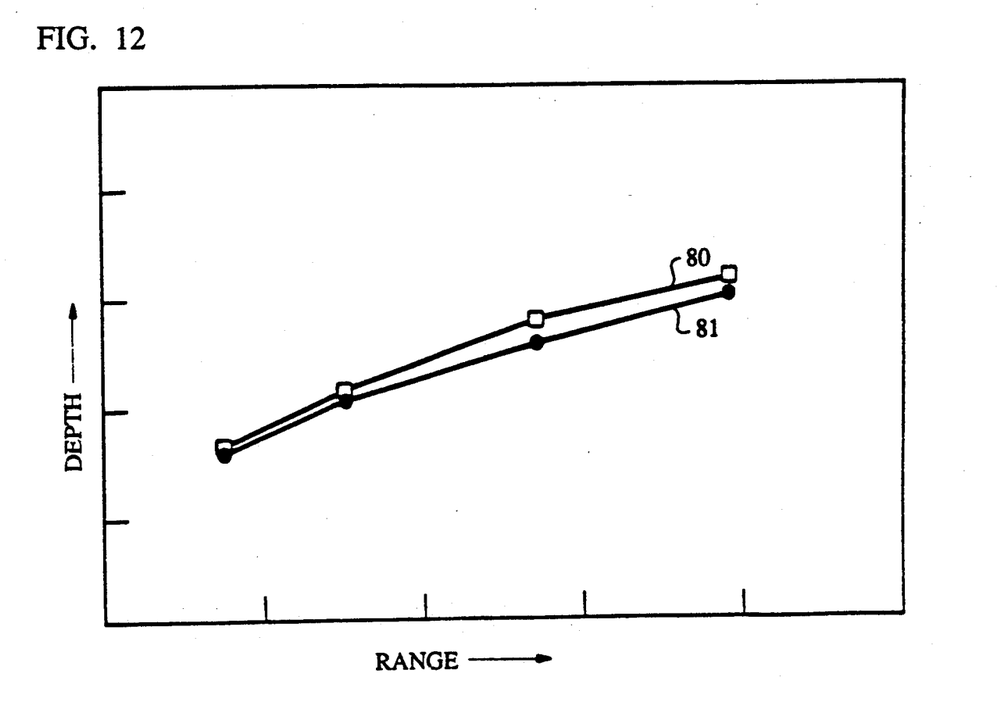
FIG. 12 on coordinates of depth and ion penetration depth, relates these parameters at increasing ion energies for two different ion dosages. This figure is of particular interest in consideration of the relationship between contributions due to baring and damage-dependent removal.

FIGS. 10, 11 and 12 relate to considerations of value in designing process parameters.

FIG. 10 on coordinates of depth and dose show the relationship between these two parameters for two different sets of conditions. Hollow data points 50 through 54 correspond with a polished smooth surface on which masking material is produced under reaction conditions producing layer thickness of tens of Å. It is seen that significant etching begins only sometime after data point 52. Solid data points 55–59 are representative of an identically processed substrate in which the thickness of the masking layer has been controlled to one or a small number of monolayers. It is seen that significant etching begins almost immediately, far sooner than that on the first sample. Virtual saturation of in terms of achieved etch depth sets in at data point 60.

General

Primary inventive thrust for preferred embodiments of the invention depend upon an extremely thin masking layer. Effective masking by so thin a layer—a layer of a maximum thickness of 100 Å—relies on the strength of the chemical bonds within the masking layer. Effective use of such a mask critically depends upon chemical bond strength within the layer (atom-to-atom bonding) which is greater than that within underlying substrate—particularly where such substrate is to be etched.

Effective masking in accordance with the invention is the direct consequence of formation of the masking layer by chemical reaction with the substrate surface. Reaction itself implicitly assures a necessary requirement. The fact that reaction takes place at all is already assurance of bond strength of reaction product which exceeds that of the substrate surface material since bonds within the surface must be broken to permit reaction. Of course, the greater bond strength of the reaction product is for the conditions and environment in which the reaction takes place. From the standpoint of temperature, since reaction is ordinarily at or above room temperature and at a safe margin below the melting point of the substrate (likely at temperature within the range of that used during MBE deposition or other preceding processing, greater bond strength implicit in reaction generally continues to the masked procedure. Greater bond strength does not, of itself, assure retention of the needed masking layer. A further requirement, is that reaction product not be gaseous or low viscosity liquid, but that it be a solid state layer in terms descriptive of an effective masking layer.

The only other requirement for the masking layer, one invariably required for any masking layer, is that it have the required stability during processing to be masked. In the preferred instance in which subsequent processing is etching, the masking layer must be of sufficient stability in the etching environment to be retained for the period required to accomplish the processing (any reaction yielding volatilized or otherwise removed reaction product of etchant-attacked mask must be sufficiently slow to permit the height differentiation required).

The invention is discussed primarily in terms of area of most significance. While procedures discussed are applicable to a wide variety of state-of-the-art devices, primary concern is with small design rule, specifically $\sim 1$ micrometer and below. In usual terms, this translates into devices having minimum feature size of 1 micrometer or below. Accordingly, discussion is largely in terms such as to assure cleanliness and the degree of perfection desired for reasonable throughput of such devices.

Procedures of the invention are discussed in terms of the preferred embodiment in which a surface to be processed is provided with a masking layer.

The masking layer is of a thickness of a maximum of 100 Å and may be as thin as a few monolayers or may even consist of a single monolayer. Historically, the invention evolved from use of a "native oxide" layer—a layer resulting from exposure of surface to be processed to air during conventional handling. In preferred practice this has yielded to masking layers of better control, for example, as produced by deliberate exposure to reactant material and as sometimes supplemented by auxiliary treatment such as dipping in aqueous hydrofluoric acid to further reduce thickness.

The character of the masking layer will likely be considered the key to the inventive teaching. It is the inventive finding that such masking layers, produced by reaction with proper reactant effectively masks in a variety of processing ambients—i.e. the masking layers in accordance with the invention, of thicknesses of tens of Å effectively replace conventional masking layers of thicknesses of many hundreds of Å or even of microns.

Masking by use of such thin layers, in addition to the advantage noted, is suited to in situ processing since masking material liberated into the atmosphere is small.

Provision of the described masking layer is conveniently regarded as the first essential step of any procedural sequence in accordance with the invention. This step is designated "step 1" even though as noted, it may, in generally non-preferred instances, take the form of "native oxide".

Step 2 provides for pattern delineation in accordance with which the masking layer is "written" by irradiation which, in accordance with a preferred embodiment, increases etch-susceptibility. Delineation has, in most instances, entailed writing with an ion beam. In examples, a Ga+ beam in the 20 keV to 150 keV energy range were used for writing. Writing speeds were such as to result in Ga+ doses ranging from $10^{13}$ to $10^{15}$ ions/cm$^2$. Actual acceleration energies and dose vary in accordance with device design and substrate material —specific values, always chosen to result in etch differentiation in step 3, are chosen in accordance with other device properties such as desired step height (between irradiated and unirradiated material).

In step 3, the irradiation-patterned substrate is exposed to further processing, in preferred embodiments, to etchant over surface region including both irradiated and unirradiated material. The etch differentiation, due to such irradiation, dictates preferred etching in irradiated regions. In usual embodiments, etching is carried out within an enclosed chamber—likely a chamber interconnected with another, or itself serving at least one prior or subsequent fabrication procedure e.g. deposition of material to be delineated or overgrowth of material following delineation (usually following mask delineation-dictated selective etching.

Etching—etchant composition, as well as time and temperature, etc.—is again in accordance with desired device properties such as step height. Etching, likely carried out within the protected environment of an enclosed chamber—perhaps at reduced pressure—generally entails use of a gaseous etchant, commonly $Cl^2$ or $F^2$. Examples herein sometimes involve heating and exposure to a flood beam of low energy ions, the latter to introduce etch-directionality (to bring about anisotropic etching). Satisfactory etching for many materials depends upon exposure to chlorine gas for times of e.g. one or a few minutes.

The three steps ennumerated may be supplemented. For example, surface to be reacted might be polished by use of e.g. bromine-methanol, as in preparation of samples plotted in subsequent figures.

FIG. 10 presents two curves both of characteristic shape. In each, depth (step height) increases rapidly after some initial exposure and finally saturates. Both samples were prepared with bromine-methanol polishing under the same conditions. One sample, that corresponding with solid data points 55-59, was further treated by dipping in HF (HF treatment is known to remove surface oxide leaving a thinned layer—tens of Å thick, see 55 *Journal of Applied Physics*, 1139 (1984)).

The untreated sample—open data points 50-54—etches more slowly as shown but ultimately saturates at data point 60. In one set of experiments, saturation occurred at a dose of about $2 \times 10^{14}$ ions/cm$^2$. Longer etching times did not result in increased step heights, but only in deeper penetration of the relief image, suggesting that the masking layer had been removed so that etching of exposed and unexposed regions proceeded thereafter at the same rate. Etch height, greater for greater energy delineation, was at saturation levels from a few hundred to a few thousand Å for the conditions described.

FIG. 11 reports the effect of varying the energy of the delineating beam. Curves 70 through 73 are for increasing beam energies, e.g., for one set of experimental conditions, 20 keV, 50 keV, 100 keV, and 150 keV. The general shape of dose dependence is, as expected, the same at different energies. Saturation dosage ($\sim 10^{15}$ ions/cm$^2$) does not change appreciably whereas step height increases approximately monotonically with energy.

In FIG. 12, data from FIG. 11 is replotted for abscissa values of calculated ion range (including straggle) for two different doses differing by about 0.5 order of magnitude. For the conditions of this particular experiment, the upper curve 80 (open square data points) was for dose of ~$10^{15}$ ions/cm$^2$ whereas curve 81 was for dose of ~$10^{14}$ ions/cm$^2$. The calculated range in Å was from ~200 to 800 for the conditions of the particular experiment.

The inventive thrust to the extent that it relies upon masking by so thin a masking layer gives rise to some difficulty in precise description. Results obtained are consistent with removal of mask in irradiated regions i.e. by direct volatilization (by sputtering). Identification of this as the operative mechanism in the numbered examples is supported by the observation that signal strength, believed to be due to secondary electron emission attendant upon sputtering, decreases at some point in time during irradiation. It is concluded that timing of such signal drop is indeed thickness dependent since the decrease occurs later in time for thicker masking layers.

Nevertheless, reliable measurement of removal of layer material of the order of Å in thickness is not assured. The possibility that removal, or at least some removal, occurs during subsequent processing—particularly during processing entailing etching of underlying substrate—cannot be ignored. The responsible mechanism for subsequent removal is likely crystallographic damage or other imperfection as locally introduced into the irradiation-defined mask regions.

In general, removal by sputtering—separation of mask delineation from subsequent etching of underlying material—is desirable. Separation of the processes is assurance of more precise monitoring of the etching step which is now uncomplicated by removal of masking material of greater bond strength and possibly of varying thickness. Direct sputtering may be assured by providing appropriate ambient constituent during pattern delineation. An appropriate constituent may take the form of reactant which combines with irradiation-heated mask material to result in reaction product which is volatilized under delineation conditions.

There are certain instances in which it may be desirable to rely primarily on irradiation-induced damage for etch selectivity. For example, where desired features are extremely shallow, e.g. tens of Å or less, presence of a masking layer during etching and consequent need for its removal during the same procedure introduces a degree of imprecision of particular consequence.

Described steps: reaction to produce a masking layer, pattern delineation to produce a mask, and subsequent processing (preferably etching to penetrate underlying substrate surface), are essential to practice of the invention. While the stated order is retained, they may be expanded to include intermediate steps. For example, as noted, etching may be followed by an additional step to still further minimize the few damage sites remaining after etching. Such additional step may take the form of a step A as set forth below, or alternatively e.g. could take the form of annealing. It is contemplated that complete fabrication of a device will entail additional processing e.g. repetition or variants of the same process steps. While the invention is of consequence in the context described, additional fabrication steps may, by their nature, be less critical. For example, a final procedure prior to encapsulation may be "conventional"—since not followed by further overgrowth may not be as critically dependent upon damage sites.

A. The surface to be processed, or undergoing processing, is ordinarily of a high degree of perfection both in terms of smoothness and contamination. Depending upon particular device demands, necessary quality may be assured by etch cleaning or polishing.

B. Surface is likely subjected to overgrowth, generally of epitaxial material, before masking. Device fabrication may require a second overgrowth step following delineation and/or etching. It is likely that devices fabricated to submicron design rules will be subjected to in situ overgrowth by MBE, CVD, or by other procedure requiring a controlled environment. Under some circumstances, step A may be repeated following step B.

Materials

As in much of this description, emphasis is placed on subject matter of particular practical significance. In this section, description of material characteristics required for implementation of the invention is primarily as applied to the fabrication of devices of particular present or prospective interest. It will be recognized that considerations discussed are applicable to other materials as well.

Devices expected to be impacted initially are electronic and/or optic. In these terms, elemental materials, primarily silicon, as well as compound materials, primarily the semiconductive III-V's, II-VI's, and more complex compound semiconductors are of interest. Optical devices of consequence within the inventive context largely concern compound semiconductors. They include emitters, (both coherent and incoherent), detectors, and passive structures such as diffraction gratings, waveguides, couplers, etc. InP is exemplary of direct bandgap materials of interest in lasers and constitutes an important area.

Elements of use for their magnetic properties—usually domain magnetic properties—may be desirably included in integrated circuits serving electronic and/or optical functions—or may serve as the primary or sole function of contemplated structures.

Damage

The role of damage cannot ordinarily be ignored. In general, it should be avoided on surface to be overgrown. On the other hand, it may serve a useful function due to etch-dependent differentiation.

Where monitoring is desirable, a number of damage-dependent characteristics may serve. These include recombination rate—minority carrier lifetime—in semiconductors, as well as luminescence efficiency and photocurrent decay time. Under some circumstances, final device characteristics, e.g. junction characteristics, may be monitored.

It has been experimentally observed that implantation (and absorption) of ion doses greater than 10 or 20 keV (absorbed density of ~10 ions/cm$^3$ results in sufficient damage for substantial etch differentiation. Standard calculations permit determination for other depths, ions, substrate materials, and energies (see "The Stopping and Range of Ions in Solids", J. F. Ziegler, J. P. Biersack and U. Littmark, Pergamon Press 1985).

Etching

Etching procedures suitable for practice of the invention share the common criterion—selectivity as between irradiated and unirradiated regions, and are accordingly "flood" systems—systems that uniformly expose a surface region including both irradiated and unirradiated regions. An aspect of the invention is concerned with optimizing, generally maximizing, etch-rate differentiation as between such regions. For certain types of etchant approaches—e.g. for the system described in an example in which exposure at first produces reaction product—to some extent in unirradiated as well as in irradiated regions—and in which actual removal depends upon thermally activated volatilization of the inherently more volatile reaction product, lowering temperature tends to increase differentiation. The system used in this example is one that depends upon selective chloride production by use of chlorine gas and in which volatilization results from flood-bombardment by argon ions.

As in all procedural steps of the invention, it is essential that device significant damage be avoided (in the usual terms in accordance with which the damage level of residual material in critical regions must be kept sufficiently low so as not to result in device-significant impairment, importantly of overgrown material). Accordingly, no part of the etching system can be such as to itself produce such damage—e.g. in the exemplary system described argon ion energy is necessarily kept below that at which unreacted surface material is affected in terms of device operation.

Suitable etchant systems depend inter alia on the nature of the surface material. For example, relative volatility of etchant-produced reaction product of group III-V elements may impose an energy constraint, in the instance of the examples, on the acceleration energy of the argon ions.

As in considerations regarding other processing steps herein, usual constraints for etching systems are primarily in terms of particular value for fabrication of fine dimensioned devices. This consideration gives rise to a need for anisotropic etching (large etch ratio of vertical re horizontal etch direction). The exemplary system supplies the needed anisotropy by use of accelerated ions. Directionality in other systems may be the consequence of a variety of mechanisms, e.g. physically directed aerosol systems, or electric field directed plasma systems, or radical beam systems, etc. In fact, etch rate differentiation has been observed and utilized in nondirectional systems such as usual wet chemical etching but this results in unsatisfactory undercutting in usually contemplated, small-dimensional devices.

Etching in accordance with the three critical steps is generally under conditions to remove all of the damaged material of device consequence—importantly to reveal "undamaged" material (to reveal material of insufficient damage to affect overgrown material in terms of device function). As discussed above, satisfaction of this criterion is realized by conditions which may be determined on the basis of test or test-developed information.

Other considerations are common to those concerning prior art fabrication techniques. Often, it is contemplated that etching conditions are such as to remove the entire thickness of a layer—such as to reveal a surface of a material of differing device characteristics (usually, of differing composition, dopant, or dopant level).

It is clear that removal of damaged material is not necessarily required at every step. A possible example is final fabrication immediately prior to encapsulation.

Overgrowth

Overgrowth of undamaged material, particulaly over etch-revealed material, is likely the aspect of the invention of greatest significance. The invention, most significantly in terms of small dimensioned devices, will likely make use of procedures such as MBE and MOCVD-procedures capable of producing the needed degree of material perfection. As before, an inventive contribution is provision of a free surface which is sufficiently damage-free to permit overgrowth of device-adequate material. Specific overgrowth materials and requisite growth conditions are or will be known to knowledgeable persons.

As above, attainment of overgrown material of requisite perfection is determinable on the basis of tests or test-derived criteria.

Device Categories

Devices, whether discrete or integrated, likely to be of initial consequence from the standpoint of the inventive teaching are of small minimum feature size (less than about 1 micrometer). Examples, as suggested above, include a broad array of optical, electronic, and other devices. A device structure considered by many as of particular future significance is dependent upon heterojunctions. Such devices represented for example by Heterojunction Bipolar Transistors, and double heterostructure lasers (See R. N. Nottenburg, Y. K. Chen, M. B. Panish, D. A. Humphrey and R. Hamm, IEEE Electron Device Letters, Vol. 10, P.30 (1989), and Heterostructure Lasers, H. C. Casey, Jr. and M. B. Panish, Academic Press (1978)) present particular fabrication difficulties which are overcome by use of the inventive processes. A general category of devices desirably fabricated in accordance with the invention include those with minimum feature size of below a few hundred angstroms in which the facility for overgrowth provides for protection against deleterious surface effects (surface depletion, excessive surface recombination velocity, contamination).

Procedures

EXAMPLES

EXAMPLE 1

The gallium beam writing was carried out by a computer controlled instrument equipped with a focused ion beam column operating at 20 keV which produces 160 pA beam in a 0.2 $\mu$m diameter spot. The ion dose at the sample was adjusted by changing the deflection pixel dwell time and could be varied from $1 \times 10^{13}$ ions/cm$^2$ to more than $1 \times 10^{18}$/cm$^2$.

The exposure pattern written on InP samples, provided with "native oxide", consisted of groups of rectangles $5 \times 30 \sim \mu$m in size. The Ga-ion dose was varied in each group, in different rectangles, from $1 \times 10^{13}$ to $9 \times 10^{14}$/cm$^2$. This range of doses results in removal of mask material as measured by secondary electron emission (reinforced by markedly reduced emission signaling permitted termination of mask delineation).

The etching was carried out in a Cl-assisted Ar-ion beam apparatus. Beam energies of 50 to 100 Volts were employed. Samples were held at a temperature of 180° C. Under these conditions, the damaged areas exhibit an etch rate at least a factor of 10 larger than the damage-free surface. This results in the formation of surface steps as deep as 1200 Å for the highest dose areas. Step depth increases with increasing Ga-dose up to $1\times10^{14}/cm^2$. The step depth changes only very slowly with higher Ga-doses. "Saturation"—attainment of maximum step height—is discussed in conjunction with FIGS. 10 and 11. The detailed dependence of the etched depth on the Ga-dose is shown in Table 1.

TABLE 1

Cl-assisted Ar ion beam etching of Ga-implanted areas

| Ga Dose ($cm^{-2}$) | Etched Depth (Å) | | |
|---|---|---|---|
| | InP | InGaAs | GaAs |
| $1 \times 10^{13}$ | <30 | | |
| $2 \times 10^{13}$ | 80 | | |
| $5 \times 10^{13}$ | 340 | | |
| $1 \times 10^{14}$ | 700 | <30 | <20 |
| $2 \times 10^{14}$ | 997 | 100 | 30 |
| $5 \times 10^{14}$ | 1130 | 2500 | 100 |
| $1 \times 10^{15}$ | 1230 | 2100 | 600 |

50 V Ar beam
T = 180° C.
t = 5 min

The patterned wafers were transferred in situ into the GSMBE growth apparatus and overgrown. The overgrown double heterostructure consists of a 1000 Å thick InP buffer layer, followed by a 500 Å thick layer of InGaAs, and a second layer of InP, also 1000 Å thick. The epitaxial layers are grown at 470° C. It takes approximately 50 min. to reach that temperature, during which time the sample has been heated to 525° C. for temperature calibration of the sample holder. In the heating cycle the surface of the sample is protected by a phosphorus beam. This procedure constitutes an unavoidable heating step in which some of the residual damage still present might be annealed. The overgrown sample was examined by optical microscopy and spatially and spectrally resolved low temperature (20 K.) cathodoluminescence (CL). Morphology of the implanted/etched/overgrown areas is uniformly excellent for the entire range of the Ga doses employed. The CL measurements show no decrease in the luminescence efficiency in the implanted/etched areas for both the InP and InGaAs band-edge recombination. This is consistent with the complete removal, by dry etching, of the implantation induced substrate damage. When the damage is not removed by dry etching, i.e. when overgrowth is carried out directly on locally implanted ("damaged") wafers, the CL measurements indicate a decrease in the luminescence efficiency. The decrease is very pronounced, down to only 40% of the control sample ("undamaged") efficiency for the Ga dose of $1\times10^{13}/cm^2$ and 10% for the $1\times10^{14}/cm^2$ dose.

EXAMPLE 2

The overgrown structure was modified to include a four period InP/InGaAs superlattice after the InP buffer layer. Each period of the superlattice consists of a 100 Å thick InGaAs well and a 150 Å thick InP barrier. The superlattice is then overgrown by a double heterostructure described in Example 1. The purpose of the superlattice is to block propagation of any residual substrate damage into the overgrown double heterostructure.

The overgrowth quality was again evaluated by low temperature CL measurements. No decrease was observed in the CL efficiency of the double heterostructures grown over the damaged and etched regions. The CL signal originating in the damaged and etched areas was found to exceed that of the control areas by as much as 15-20%.

EXAMPLE 3

The focused Ga-beam implantation was carried out with InP under conditions described in Example 1. The individual implanted rectangle size was reduced to $0.2 \times 30$ μm, the spatial resolution limit of the Ga-beam apparatus. Etching was carried out using procedures described in Example 1. Epitaxial regrowth consisted of a four-period superlattice described in Example 3. The CL measurements again showed a 15-20% increase in the luminescence efficiency of the very small structures grown over the damaged and etched areas. This demonstrates that high quality overgrowth is maintained even for very small structures, in which the edge (surface) effects are increasingly important.

EXAMPLE 4

Ga beam writing under conditions described in Example 1 was carried out on the epitaxial film, 1 μm thick, of $In_{0.53}Ga_{0.47}As$ grown epitaxially on lattice-matched InP substrate. The sample was then etched using conditions of Example 1. This results in formation of surface steps as deep as 2500 Å for the high dose areas. The detailed dependence of the etched depth on the Ga dose is shown in Table 1.

EXAMPLE 5

The process described in Example 4 was carried out on a GaAs substrate. It should be noted that the dry etching conditions employed (temperature, time, $Cl_2$ partial pressure, beam energy, etc.) were optimized for InP and not for GaAs. Nevertheless surface steps of significant depth were formed in the GaAs substrate. The detailed dependence is again shown in Table 1.

Variations in processing conditions, as well as materials, establish suitability of inventive processes to fabrication of a large variety of devices. Procedures of the type described in the examples have been carried out using deliberately formed mask layers in lieu of "native oxide". Such layers are formable by direct reaction with oxygen as well as other cations, e.g. sulphur. Chlorine etching, as aided or unaided e.g. by ion bombardment, is illustrative of procedures likely suitable in commercial device fabrication. Silicon etching, on the other hand, is usefully carried out with the more reactive material, fluorine.

It may be observed that ion bombardment, while assisting in terms of anisotropy, does likely attack unirradiated mask material. This, in turn, imposes an additional limit on maximum step height (on "saturation" etching). Accordingly, under some circumstances desired maximization of step height (for particular mask composition/thickness) may dictate minimization or even exclusion of ion bombardment.

A variety of considerations may give rise to process variation. For example, unwanted evolution of substrate constituent has been minimized by e.g. overpressure of such constituent. Phosphorus overpressure during InP processing (e.g. during thermal desorption of residual mask) represents such an instance. Some study has been given removal of mask material—e.g. of residual mass material in unirradiated regions—both before and after processing following pattern delineation. The indication is that such removal depends upon bond scission of immediately underlying substrate material rather than of the mask material itself.

Experimental work has been largely in the form of pattern delineation by means of a moving ion beam. Description of the invention does not depend upon this precise approach but may rely on patterned flood (masked) irradiation as well as on use of other energy, e.g. accelerated electrons, effective in removal or even of introduction of removal-dependent modification.

We claim:

1. Process for fabricating a circuit comprising a plurality of interconnected devices said circuit being designed using design rules based on a minimum dimension of a maximum of 1 $\mu$m characterized in that said process comprises at least one set including two procedures, procedure 1 and procedure 2, said two procedures being carried out in the order stated, said two procedures not necessarily sequential;

procedure 1 comprising patterning a surface of a body comprising device functional material by selectively irradiating portions of said surface so as to produce an irradiation pattern, said portions being altered by irradiation in terms of differentiation during procedure 2, procedure 2 comprising uniform exposing of at least a region of the irradiation-patterned surface, said region including irradiated as well as unirradiated material, to ambient which selectively modifies surface within said portions, in which said surface, prior to procedure 1, is free of masking material of a thickness greater than 100 Å, in which said surface prior to procedure 1 is covered with a masking layer consisting essentially of a reaction product resulting from reaction of said surface with a first reactant, and in which selective irradiation results in removal of portions of such layer in regions irradiated, in which said first reactant consists essentially of oxygen.

2. Process of claim 1 in which procedure 2 is an etching procedure and in which such etching procedure removes masking material residue remaining following procedure 1.

3. Procedure of claim 1 in which procedure 2 is an etching procedure and in which such etching procedure removes crystallographically damaged surface of the said body as damaged during selective irradiating.

* * * * *